(12) United States Patent
Chen

(10) Patent No.: US 6,486,500 B1
(45) Date of Patent: Nov. 26, 2002

(54) LED STRUCTURE HAVING A SCHOTTKY CONTACT AND MANUFACTURING METHOD

(75) Inventor: Shi-Ming Chen, Tainan (TW)

(73) Assignee: Epitech Corporation, Ltd., Tainan (TW)

( * ) Notice: Subject to any disclaimer, the term of this patent is extended or adjusted under 35 U.S.C. 154(b) by 0 days.

(21) Appl. No.: 10/055,953

(22) Filed: Jan. 28, 2002

(30) Foreign Application Priority Data

Dec. 4, 2001 (TW) ........................................ 90130035 A

(51) Int. Cl.⁷ .............................................. H01L 33/00
(52) U.S. Cl. .............................. 257/99; 257/81; 257/79
(58) Field of Search ................................ 257/99, 81, 79

(56) References Cited

U.S. PATENT DOCUMENTS

| | | | | |
|---|---|---|---|---|
| 5,278,432 A | * | 1/1994 | Ignatius et al. | 257/723 |
| 5,744,845 A | * | 4/1998 | Sayama et al. | 257/371 |
| 5,953,587 A | * | 9/1999 | Forrest et al. | 257/40 |
| 6,188,137 B1 | * | 2/2001 | Yagura et al. | 257/383 |
| 2002/0005523 A1 | * | 1/2002 | Taniguchi et al. | 257/79 |

FOREIGN PATENT DOCUMENTS

| | | | | |
|---|---|---|---|---|
| EP | 0 116 304 | * | 8/1984 | H01L/31/12 |
| JP | 402256287 A | * | 10/1990 | H01S/3/18 |

* cited by examiner

*Primary Examiner*—Olik Chaudhuri
*Assistant Examiner*—William C Vesperman
(74) *Attorney, Agent, or Firm*—Powell Goldstein Frazer & Murphy LLP

(57) ABSTRACT

A structure and manufacturing method of LED is disclosed. The manufacturing method of the structure of LED comprises: providing a substrate; on the substrate, forming in sequence a buffer layer, a first confining layer, an active layer, a second confining layer and a window layer; forming a first metal electrode beneath the substrate; forming a second metal electrode on the window layer, wherein there is a schottky contact surface between the second metal electrode and the window layer; forming a third metal electrode on the second metal electrode, wherein the third metal electrode has a feature of high melting point; forming a fourth metal electrode on the third metal electrode and the window layer, wherein there is an ohmic contact surface between the window layer and the fourth metal electrode; and forming a fifth metal electrode on the fourth metal electrode, wherein the fifth metal electrode has a feature of good adhesion, and when the substrate, the buffer layer and the first confining layer are n-type or p-type, the type of the second confining layer and window layer are opposite. The carriers are blocked from moving downward by the energy barrier between the schottky electrode and the window layer, so that the carriers are forced to spread around enormously. Furthermore, by utilizing the third metal electrode having high melting point to be a block between the fourth metal electrode and the second metal electrode, the schottky contact induced between the window layer and the second metal electrode can be maintained. Thus, irradiation efficiency of LED is enhanced.

20 Claims, 4 Drawing Sheets

LED STRUCTURE HAVING A SCHOTTKY CONTACT AND MANUFACTURING METHOD

FIELD OF THE INVENTION

The present invention relates to a structure and a manufacturing method of light emitting diode (LED), and more particularly relates to a LED structure having an electrode with a schottky contact and to a manufacturing method thereof. By reducing the quantity of carriers in an area under the electrode, the carriers can be distributed over the active region efficiently. Thus, the output intensity of light can be enhanced.

BACKGROUND OF THE INVENTION

Nowadays, because LED has advantages of low manufacturing cost, low manufacturing difficulty level, easy and convenient installation and good development future, LED is used widely in daily life, such as electronic bulletin boards, indicator lights and car taillights, etc. However, how to further enhance the irraidation efficiency of LED is still a target on which engineers are working.

Referring to FIG. 1, FIG. 1 is a cross-sectional view showing the structure of a conventional LED. The conventional LED is grown by metal organic chemical vapor deposition (MOCVD) or molecular beam epitaxy (MBE). First, a buffer layer 102, a first confining layer 104, an active layer 106, a second confining layer 108 and a window layer 110 are formed on a substrate 100 sequentially, and then, by performing an evaporation step, a upper metal electrode 112 is formed on the window layer 110 and a backside electrode 114 is formed by evaporation beneath the substrate 100.

Current leaves or enters the window layer 110 through the upper metal electrode 112 of LED 90, and then the carriers arrive the active layer 106 after passing the second confining layer 108 uniformly by diffusion. Therefore, due to the carrier recombination, the active layer 106 ejects out photons thereby emitting light for the LED 90.

As the aforementioned description, the main current flow path is an area under the upper metal electrode 112, and the area contains plenty of carriers, so that the carriers can not be spread efficiently to the whole window layer 110 and to the whole chip. Hence, the main radiation combining area 116 is located on the center of the active layer 106 (the area beneath the upper metal electrode 112).

However, since most of carriers are only injected to the position under the upper metal electrode 112 during the operation of LED, and due to the Current Crowding Phenomenon that the carriers are concentrated under the upper metal electrode 112, there are no enough carriers to perform radiative recombination in the other position of the active layer 106. Thus, most of light emitted from the active layer 106 is either blocked and reflected by the upper metal electrode 112, or is absorbed by semiconductor, so that the emitting efficiency of LED 90 is decreased and is not be satisfied.

Referring to FIG. 2, FIG. 2 is a cross-sectional view showing the structure of another conventional LED. In order to resolve the aforementioned problem, the thickness of the window layer is increased for enhancing the spreading current. Another method of improving the Current Crowding Phenomenon is to formed a current blocking layer 118 beneath the upper metal electrode 112 in the subsequent process as shown in the FIG. 1 after forming the second confining layer 108 as shown in the FIG. 1. The carriers are blocked from moving downward by using the energy barrier and the electric field induced in the depletion region in the current blocking layer 118, so that the carriers beneath the upper metal electrode 112 are forced to be distributed allover the chip, and the main radiation combining area 116 is located on the active layer 106's other areas which are not under the upper metal electrode 112. Therefore, the photons emitted from the active layer 106 will not be blocked by the opaque upper metal electrode 112, so that the light output intensity is enhanced.

Nevertheless, in the method of increasing the thickness of the window layer 110 for enhancing the spreading current, the thickness of the window layer 110 has to be about 5 $\mu$m or over, which takes longer production time for forming the epitaxy and thus increases the production cost. In the other method of forming the current blocking layer 118 on the second confining layer 108, the current blocking layer has to be formed by using MOCVD twice. After the second confining layer 108 is formed, the chip needs to be moved out of the chamber for forming the current blocking layer 118, and after the current blocking layer 118 is formed, the chip is moved into the chamber again for performing the subsequent steps to complete the remaining structure. The additional step for forming the current blocking layer 118 results the extension of production time, the increase of production cost and the decrease of yield.

SUMMARY OF THE INVENTION

In view of the background of the invention described above, the LED with high efficient is urgently needed, so that many conventional methods for improving the light efficiency of LED are developed. In a conventional LED manufacturing process, for improving the current crowding phenomenon, a current blocking layer is formed on the second confining layer for blocking the carriers from moving downward and for forcing the carriers to spread around the chip. However, forming the current blocking layer has to employ MOCVD twice, before performing the subsequent steps. Because of additional step for forming the current blocking layer in the conventional manufacturing process of LED, the production time is extended, and the production cost is increased.

It is the principal object of the present invention to provide a LED structure and a manufacturing method thereof, and more particularly to provide a LED structure having an electrode with a schottky contact, and to provide a method for manufacturing the LED structure. In the present invention, by forming the schottky contact between the metal electrode and the window layer, the carriers are blocked from moving downward by using the energy barrier, and are forced to spread out, thereby enhancing the light output intensity.

In accordance with the aforementioned purposes of the present invention, the present invention provides a structure and a manufacturing method of LED, and the manufacturing method comprises: providing a first-type substrate; forming a first-type buffer layer on the first-type substrate; forming a first-type first confining layer on the first-type buffer layer; forming an active layer on the first-type first confining layer; forming a second-type confining layer on the active layer; forming a second-type window layer on the second-type confining layer; forming a first metal electrode beneath the first-type substrate, wherein there is a first ohmic contact surface between the first metal electrode and the first-type substrate; forming a second metal electrode on the second-type window layer, wherein there is a schottky contact surface between the second metal electrode and the second-type window layer; forming a third metal electrode on the second metal electrode, wherein the third metal electrode has a feature of high melting point; forming a fourth electrode on the third metal electrode and the second-type window layer, wherein there is a second ohmic contact surface between the fourth electrode and the second-type window layer; and forming a fifth metal electrode on the fourth electrode, wherein the fifth metal electrode has a feature of good adhesion, and when the first-type substrate, the first-type buffer layer and the first-type first confining layer are n-type, the second-type second confining layer and the second-type window layer are p-type, and when the first-type substrate, the first-type buffer layer and the first-type first confining layer are p-type, the second-type second confining layer and the second-type window layer are n-type.

Since there is a schottky contact surface between the second metal electrode and the second-type window layer, and the third metal electrode having the feature of high melting point is located between the second metal electrode and the fourth metal electrode, thus the carriers are blocked from moving downward and forced to spread out, and the schottky contact can be maintained, for enhancing the light output intensity by using the energy barrier. Thus, the thickness of the current-spreading layer can be diminished with a proper adjustment of the process, wherein the current blocking layer is no longer need, and the efficiency of carriers spreading around the chip can be maintained at the same time. Hence, the epitaxial material cost and the production time can be reduced because no additional current blocking layer is required, thereby increasing the throughput and the yield.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

Figure 1:
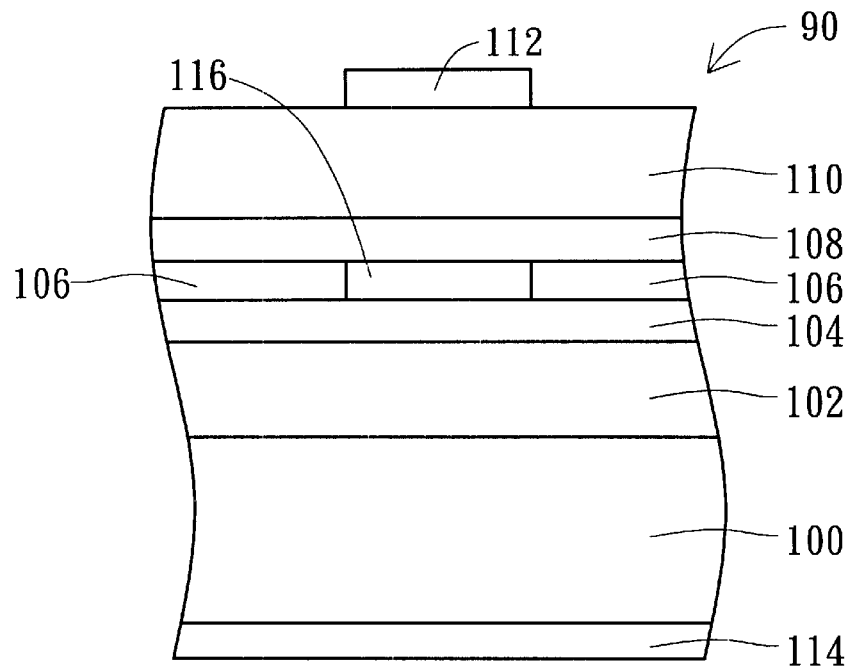
FIG. 1 is a cross-sectional view showing the structure of a conventional LED.
Figure 2:
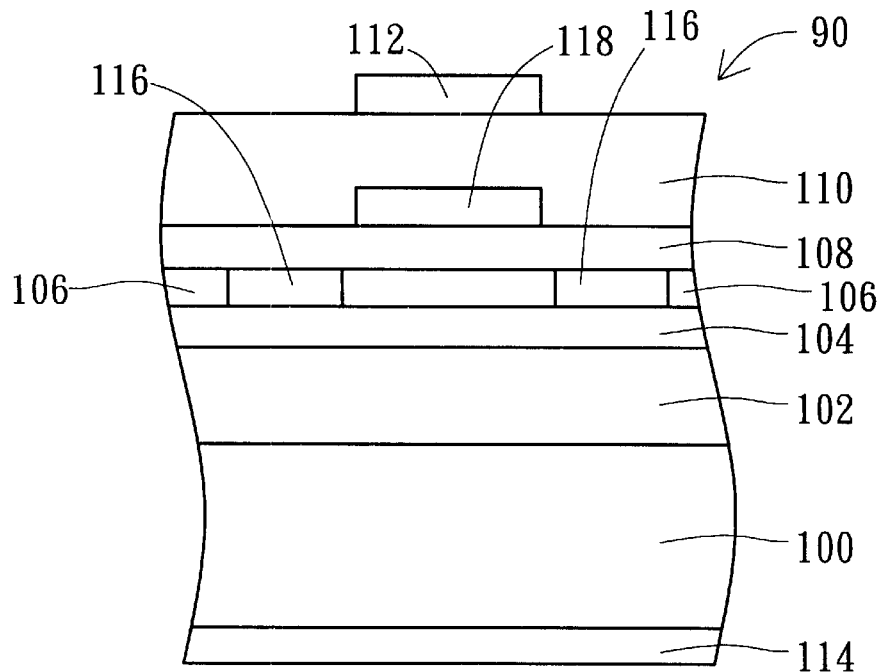
FIG. 2 is a cross-sectional view showing the structure of another conventional LED.
Figure 3:
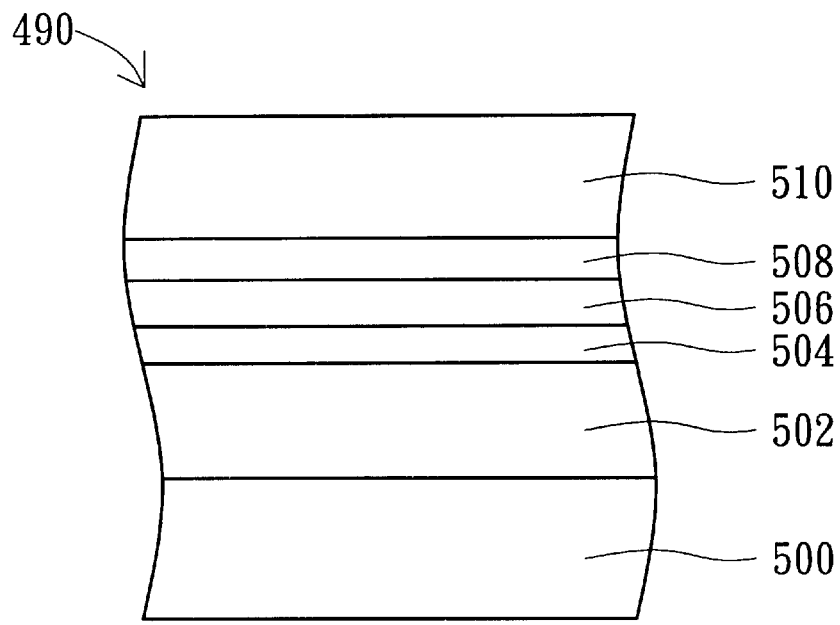
FIG. 3 is a cross-sectional view showing the structure of a LED manufactured according to an embodiment of the present invention.

Referring to FIG. 3, FIG. 3 is a cross-sectional view showing the structure of a LED manufactured according to an embodiment of the present invention. First, a substrate 500 is provided, and then a buffer layer 502, a first confining layer 504, an active layer 506, a second confining layer 508 and a window layer 510 are formed on the substrate 500 sequentially by utilizing MOCVD or MBE.

In the aforementioned structure, the substrate 500 can be made of GaAs or Si; The buffer layer 502 can be made of GaAs, or $GaAs/Al_xGa_{1-x}As_yP_{1-y}$ ($0 \leq x \leq 1$; $0 \leq y \leq 1$), or $GaAs/(Al_xGa_{1-x})_yIn_{1-y}P_zAs_{1-z}$ ($0 \leq x \leq 1$; $0 \leq y \leq 1$; $0 \leq z \leq 1$), and the material thereof also has the structure of single quantum well, or multiple quantum well, or is a superlattice structure; The first confining layer 504 can be made of $(Al_xGa_{1-x})_yIn_{1-y}P_zAs_{1-z}$ ($0 \leq x \leq 1$; $0 \leq y \leq 1$; $0 \leq z \leq 1$); The material of the active layer 506 can be made of $GaAs/(Al_xGa_{1-x})_yIn_{1-y}P_zAs_{1-z}$ ($0 \leq x \leq 1$; $0 \leq y \leq 1$; $0 \leq z \leq 1$), and the material thereof has the structure of double Hetero-junction, or single quantum well, or multiple quantum well; The second confining layer 508 can be made of $(Al_xGa_{1-x})_yIn_{1-y}P_zAs_{1-z}$ ($0 \leq x \leq 1$; $0 \leq y \leq 1$; $0 \leq z \leq 1$); The window layer 510 can be made of GaP or $Al_xGa_{1-x}As$ ($0 \leq x \leq 1$). Moreover, when the substrate 500, the buffer layer 502 and the first confining layer 504 are n-type, the second confining layer 508 and the window layer 510 are p-type; when the substrate 500, the buffer layer 502 and the first confining layer 504 are p-type, the second confining layer 508 and the window layer 510 are n-type.

Figure 4:
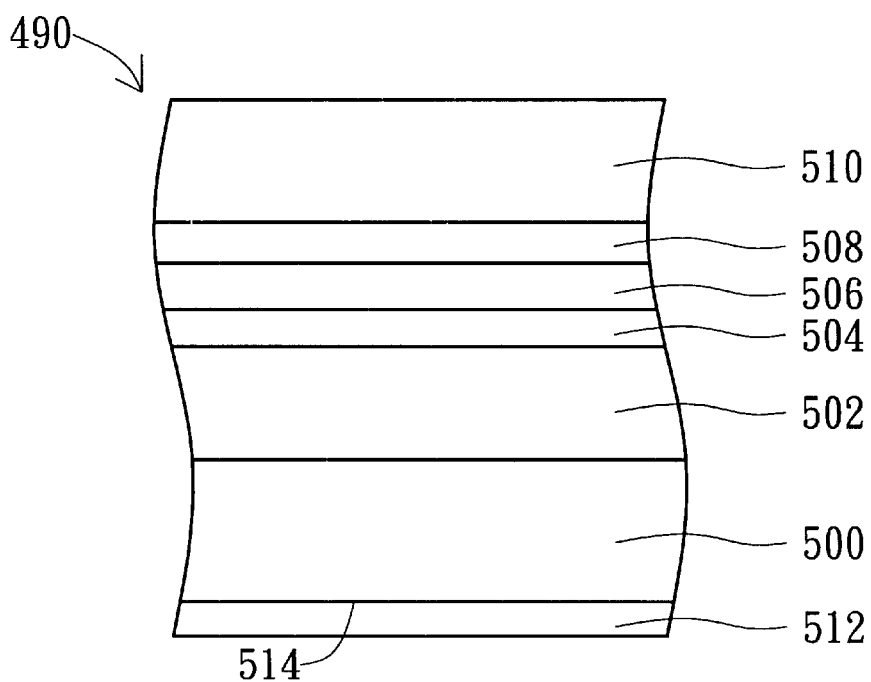
FIG. 4 is a cross-sectional view showing the structure of a LED manufactured according to an embodiment of the present invention.

Then, referring to FIG. 4, FIG. 4 is a cross-sectional view showing the structure of a LED manufactured according to an embodiment of the present invention. The metal electrode 512 is formed beneath the substrate 500 by utilizing thermal evaporation, or E-beam evaporation, or sputtering, etc., so that an ohmic contact surface 514 is formed between the metal electrode 512 and the substrate 500. The resistance between the metal electrode 512 and the substrate 500 can be decreased by further utilizing thermal annealing.

Figure 5:
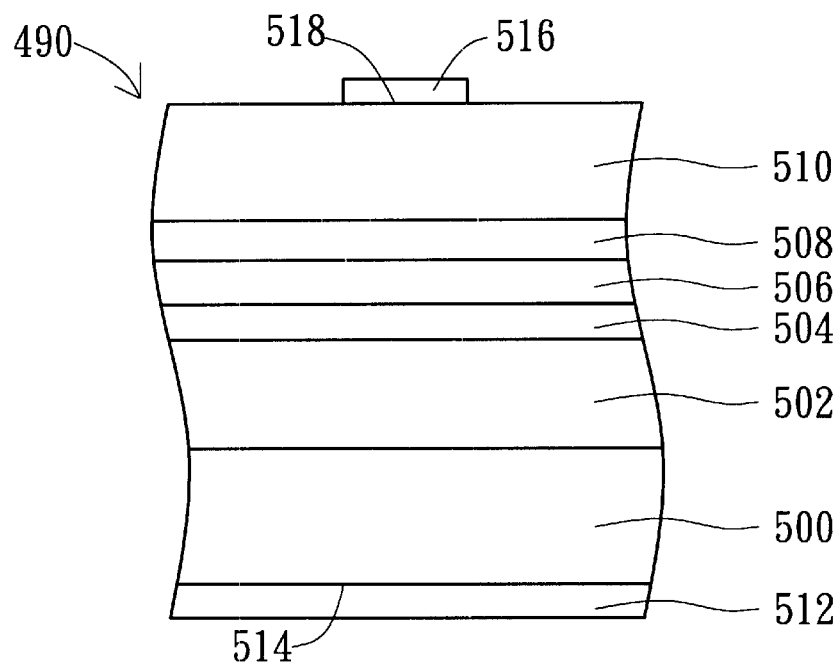
FIG. 5 is a cross-sectional view showing the structure of a LED manufactured according to an embodiment of the present invention.

Referring to FIG. 5, FIG. 5 is a cross-sectional view showing the structure of a LED manufactured according to an embodiment of the present invention. Afterwards, by utilizing thermal evaporation, or E-beam evaporation, or sputtering, etc., the schottky electrode 516 is formed and defined on the window layer 510 through the method of lithography or metal mask, etc., so that a schottky contact surface 518 is formed between the window layer 510 and the schottky electrode 516. Moreover, when the window layer 510 is n-type, the schottky electrode 516 can be made of the material selected from the group consisting of Au, Zn, Be and other metal or alloy that can form the schottky contact surface 518 with the window layer 510; when the window layer 510 is p-type, the schottky electrode 516 can be made of the material selected from the group consisting of Au, Ge, Ni and other metal or alloy that can form the schottky contact surface 518 with the window layer 510, and furthermore, the surface pattern of the schottky electrode 516 is not limited and is based on the design of LED 490.

Figure 6:
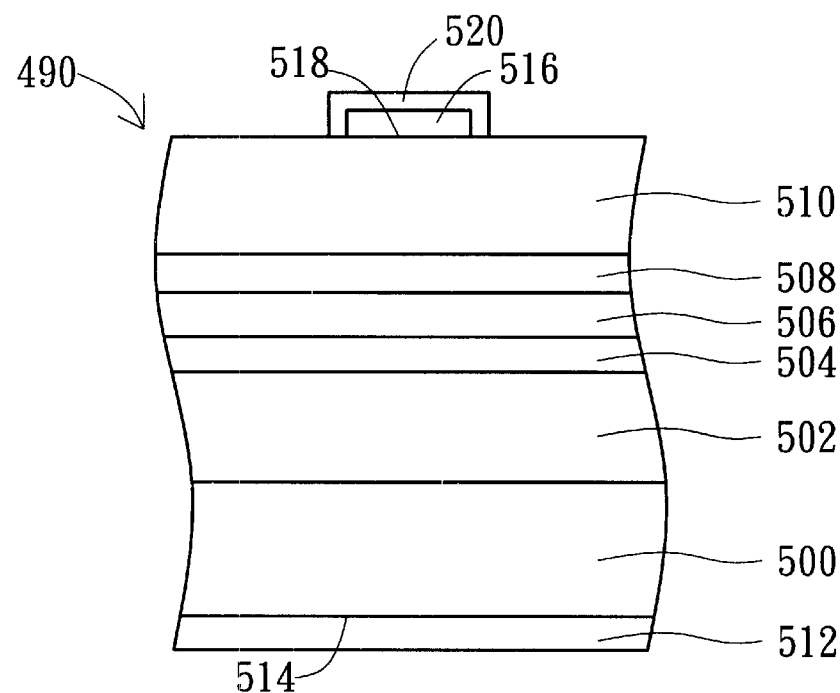
FIG. 6 is a cross-sectional view showing the structure of a LED manufactured according to an embodiment of the present invention.

Referring to FIG. 6, FIG. 6 is a cross-sectional view showing the structure of a LED manufactured according to an embodiment of the present invention. After the schottky electrode 516 is formed, by utilizing thermal evaporation, or E-beam evaporation, or sputtering, etc., the metal electrode 520 having the features of high melting point and anti-interpenetration is formed and defined on the schottky electrode 516 through lithography or metal mask, etc., so that the schottky electrode 516 is covered totally or partially by the metal electrode 520.

Since an ohmic electrode has to be formed on the metal electrode 520 and the window layer 510 in the subsequent process, it is required that the metal electrode 520 is used for isolating the schottky electrode 516 and the ohmic electrode after the schottky electrode 516 is formed and before the ohmic electrode. Therefore, the metal electrode 516 needs to have the features of high melting point and impermeability to prevent the permeation between the schottky electrode 516 and the ohmic electrode, wherein the permeation will influence the feature of current-rectification of schottky. The material of the metal electrode 516 can be selected from the group consisting of metal, conductive metal oxide and conductive metal nitride, such as Ti, Pt, W, ITO and TiN, etc.

Figure 7:
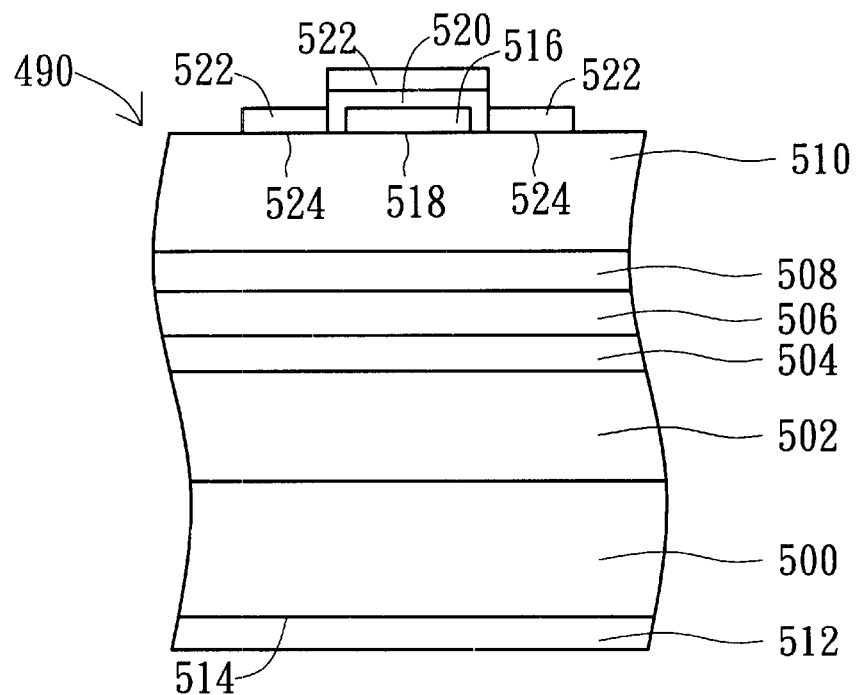
FIG. 7 is a cross-sectional view showing the structure of a LED manufactured according to an embodiment of the present invention.

Referring to FIG. 7, FIG. 7 is a cross-sectional view showing the structure of a LED manufactured according to an embodiment of the present invention. After the metal electrode 520 is formed to cover all or part of the schottky electrode 516, by utilizing thermal evaporation, or E-beam evaporation, or sputtering, etc., the ohmic electrode 522 is formed and defined on the metal electrode 520 and window layer 510 through lithography or metal mask, etc., so as to cover part of all of the metal electrode 520 and the window layer 510 respectively. Therefore, an ohmic contact surface 524 is formed between the ohmic electrode 522 and the window layer 510. Furthermore, the surface pattern of the ohmic electrode 522 is not limited and is based on the design of LED 490.

When the window layer 510 is n-type, the ohmic electrode 522 can be made of the material selected from the group consisting of Au, Ge, Ni and other metal or alloy which can form the ohmic contact surface 524 with the window layer 510. When the window layer 510 is p-type, the ohmic electrode 522 can be made of the material selected from the group consisting of Au, Zn, Be and other metal or alloy which can form the ohmic contact surface 524 with the window layer 510. Furthermore, the emitting efficiency of LED 490 can be increased by utilizing a transparent ohmic electrode.

Figure 8:
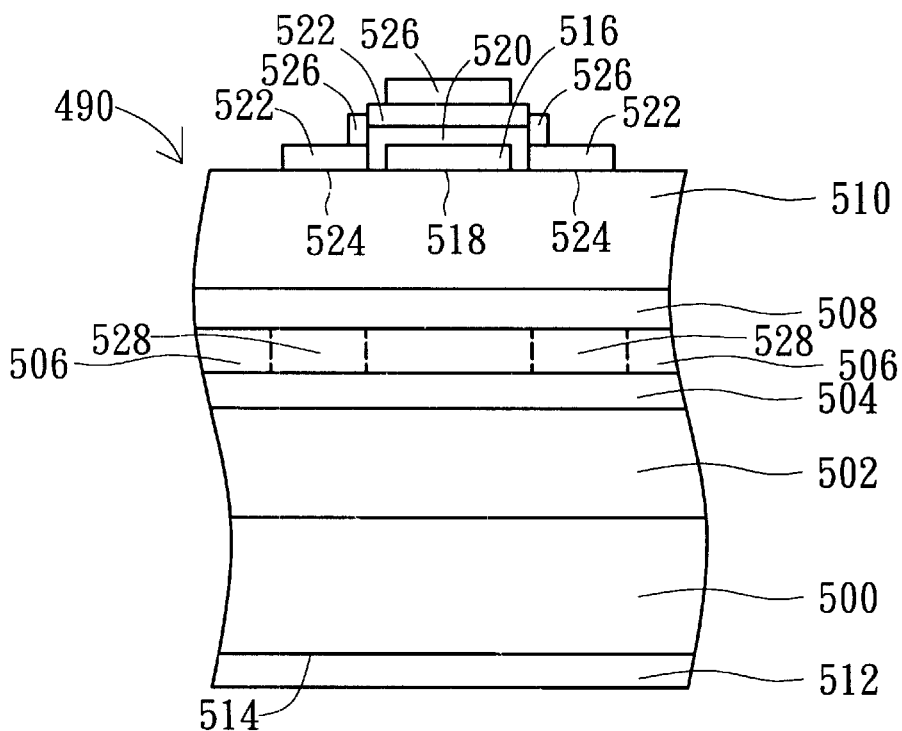
FIG. 8 is a cross-sectional view showing the structure of a LED manufactured according to an embodiment of the present invention.

Referring to FIG. 8, FIG. 8 is a cross-sectional view showing the structure of a LED manufactured according to an embodiment of the present invention. Due to the higher energy gap induced by the schottky contact surface 518 formed between the window layer 510 and the schottky electrode 516, and the lower energy gap induced by the ohmic contact surface 524 formed between the window layer 510 and the ohmic electrode 522, the current is blocked from flowing because the flow path is blocked by the higher energy gap, and the carriers are forced to spread out through the lower energy gap and flows into the window layer 510. Therefore, the quantity of carriers are reduced greatly and the main radiation combining area is not still concentrated on the area under the schottky electrode 516, so that the emitting photons are not blocked by the schottky electrode 516 and the light output intensity can be enhanced. The metal electrode, having the features of high melting point and impermeability is used to prevent the permeation between the schottky electrode 516 and the ohmic electrode 522, and to prevent the decrease of the higher energy gap in the schottky contact surface 518 and the increase of the lower energy gap in the ohmic contact surface 524.

After the ohmic electrode 522 is formed, by utilizing thermal evaporation, or E-beam evaporation, or sputtering, etc., the metal electrode 526 (the metal electrode pad) is formed and defined on the ohmic electrode 522 through lithography or metal mask, etc., to cover part or all of the ohmic electrode 522, and the surface pattern of the metal electrode 526 is not limited and is based on the design of LED 490.

The metal electrode 526 can be made of the material selected from the group consisting of Au, Ti, Ni, In, Pt, Al and other metal or alloy that has the feature of high adhesion with the ohmic electrode 522 and with the metallic balls formed in wire bonding. Moreover, the material of the metal electrode 526 should not diff-use to the ohmic electrode 522 for avoiding the decrease of the transparency of the ohmic electrode 522.

Moreover, if the substrate 500 is removed by polishing or chemical etching, etc., and the LED is disposed on other substrates either permanently or temporarily, the schottky electrode 516, the metal electrode 520, the ohmic electrode 522 and the metal electrode 526 can be formed similarly by utilizing the manufacturing method of the LED provided by the present invention.

The advantage of the present invention is to provide a structure and a manufacturing method of the LED, and more particularly to provide a LED structure having an electrode with a schottky contact and a manufacturing method thereof. In the manufacturing method of LED provided by the present invention, the current blocking layer is not required to be formed on the second confining layer, and the carriers are blocked from moving downward by the energy barrier between the schottky electrode and the window layer. Therefore, the carriers are forced to spread around enormously, so that the carrier-spreading efficiency better than that from the conventional structure of LED can be obtained resulting in better irradiation efficiency.

Another advantage of the present invention is to provide a structure and a manufacturing method of the LED. In the manufacturing method of LED provided by the present invention, since the carriers are blocked by the energy barrier between the schottky electrode and the second confining layer, and are forced to spread around, the thickness of the window layer and the epitaxial material can thus be decreased by adjusting the process properly with maintaining the efficiency of carriers spreading around the chip. Therefore, the manufacturing method of LED provided by the present invention is simple and time-saving, so that the epitaxial material cost and the production time cost can be reduced for further increasing the throughput.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A structure of LED, comprising:

a substrate, having a first-type conductibility;

an epitaxial structure, on one side of the substrate, the epitaxial structure having a plurality of epitaxial semi-conducting layers made of III-V group compounds, a plurality of photons generated when current is injected; and an electrode structure, on the epitaxial structure, and the electrode structure comprising:

a first electrode, on the epitaxial structure, the first electrode having a first surface pattern, wherein there is a schottky contact surface between the first electrode and the epitaxial;

a second electrode, on the first electrode, and the second electrode has a second surface pattern;

a third electrode, on the second electrode and the epitaxial structure, the third electrode having a third surface pattern, wherein there is a first ohmic contact surface between the epitaxial structure and the third electrode; and a fourth electrode, on the third electrode.

2. The structure of LED according to claim 1, wherein further comprises a metal electrode on the other side of the substrate, and there is a second ohmic contact surface between the metal electrode and the substrate.

3. The structure of LED according to claim 1, wherein the epitaxial structure comprises a window layer having a second-type conductibility.

4. The structure of LED according to claim 3, wherein the first-type conductibility is n-type and the second-type conductibility is p-type, and the first electrode is made of the material selected from a group consisting of Au, Ge, Ni, and metals and alloys, wherein the metals and alloys can form the schottky contact surface with the window layer, and the third electrode is made of the material selected from a group consisting of Au, Zn, Be, and metals and alloys, wherein the metals and alloys can form the first ohmic contact surface with the window layer.

5. The structure of LED according to claim 3, wherein the first-type conductibility is p-type and the second-type conductibility is n-type, and the first electrode is made of the material selected from a group consisting of Au, Zn, Be, and metals and alloys, wherein the metals and alloys can form the schottky contact surface with the window layer, and the third electrode is made of the material selected from a group consisting of Au, Ge, Ni, and metals and alloys, wherein the metals and alloys can form the first ohmic contact surface with the window layer.

6. The structure of LED according to claim 1, wherein the second electrode is made of the material selected from a group consisting of metal, conductive metal oxide and conductive metal nitride.

7. The structure of LED according to claim 1, wherein the second electrode is made of the material selected from a group consisting of Ti, Pt, W, ITO, TiN and metal having the features of high melting point and impermeability.

8. The structure of LED according to claim 1, wherein the fourth electrode is made of the material selected from a group consisting of Au, Ti, Ni, In, Pt, Al and metal having the feature of high adhesion with the third electrode and metallic balls formed in wire bonding.

9. The structure of LED according to claim 1, wherein the first surface pattern, the second surface pattern and the third surface pattern are any shape.

10. The manufacturing method of LED, comprising:
providing a substrate having a first-type conductibility;
forming a buffer layer on the substrate, the buffer layer having the first-type conductibility;
forming a first confining layer on the buffer layer, the first confining layer having the first-type conductibility;
forming an active layer on the first confining layer;
forming a second confining layer on the active layer, the second confining layer having a second-type conductibility;
forming a window layer on the second confining layer, the window layer having the second-type conductibility;
forming a first electrode beneath the substrate, wherein a first ohmic contact surface is formed between the first electrode and the substrate;
forming a second electrode on the window layer, wherein a schottky contact surface is formed between the second electrode and the window layer;
forming a third electrode on the second electrode, and the window layer;
forming a fourth electrode on the third electrode and the window layer, wherein a second ohmic contact surface is formed between the fourth electrode and the window layer; and
forming a fifth electrode on the fourth electrode.

11. The manufacturing method of LED according to claim 10, wherein the first-type conductibility is n-type and the second-type conductibility is p-type, and the second electrode is made of the material selected from a group consisting of Au, Ge, Ni, and metals and alloys, wherein the metals and alloys can form the schottky contact surface with the window layer, and the fourth electrode is made of the material selected from a group consisting of Au, Zn, Be, and metals and alloys, wherein the metals and alloys can form the second ohmic contact surface with the window layer.

12. The manufacturing method of LED according to claim 10, wherein the first-type conductibility is p-type and the second-type conductibility is n-type, and the second electrode is made of the material selected from a group consisting of Au, Zn, Be, and metals and alloys, wherein the metals and alloys can form the schottky contact surface with the window layer, and the fourth electrode is made of the material selected from a group consisting of Au, Ge, Ni, and metals and alloys, wherein the metals and alloys can form the second ohmic contact surface with the window layer.

13. The manufacturing method of LED according to claim 10, wherein the step of forming the first electrode beneath the substrate, the step of forming the second electrode on the window layer, the step of forming the third electrode on the second electrode, the step of forming the fourth electrode on the third electrode and the window layer and the step of forming the fifth electrode on the fourth electrode are performed with the method selected from a group consisting of thermal evaporation, E-beam evaporation, and sputtering.

14. The manufacturing method of LED according to claim 10, wherein the step of forming the third electrode on the second electrode comprises defining the third electrode on the second electrode to cover part or all of the second electrode.

15. The manufacturing method of LED according to claim 10, wherein the step of forming the fourth electrode on the third electrode comprises defining the fourth electrode on the third electrode and the window layer to cover part or all of the third electrode and the window layer, or to cover all of the third electrode and part of the window layer.

16. The manufacturing method of LED according to claim 10, wherein the step of forming the fifth electrode on the fourth electrode comprises defining the fifth electrode on the fourth electrode to cover part of the fourth electrode.

17. The manufacturing method of LED according to claim 10, wherein the second electrode, the third electrode, the fourth electrode and the fifth electrode have an unlimited surface pattern respectively.

18. The manufacturing method of LED according to claim 10, wherein the third electrode is made of the material selected from a group consisting of metal, conductive metal oxide and conductive metal nitride.

19. The manufacturing method of LED according to claim 10, wherein the third electrode is made of the material selected from a group consisting of Ti, Pt, W, ITO, TiN and metal having the features of high melting point and impermeability.

20. The manufacturing method of LED according to claim 10, wherein the fifth electrode is made of the material selected from a group consisting of Au, Ti, Ni, In, Pt, Al and metal having the feature of high adhesion with the fourth electrode and metallic balls formed in wire bonding.

* * * * *